Nov. 4, 1969 L. S. CUTLER ET AL Re. 26,707

CRYSTAL RESONATORS

Original Filed May 25, 1964

INVENTORS
LEONARD S. CUTLER
DONALD L. HAMMOND

BY A. C. Smith
ATTORNEY

United States Patent Office

Re. 26,707
Reissued Nov. 4, 1969

26,707
CRYSTAL RESONATORS

Leonard S. Cutler, Topsfield, Mass., and Donald L. Hammond, Los Altos Hills, Calif., assignors to Hewlett-Packard Company, Palo Alto, Calif., a corporation of California Original No. 3,339,091, dated Aug. 29, 1967, Ser. No. 369,934, May 25, 1964. Application for reissue Feb. 11, 1969, Ser. No. 802,287
Int. Cl. H03b *5/30*
U.S. Cl. 310—9.1 9 Claims

Matter enclosed in heavy brackets [ ] appears in the original patent but forms no part of this reissue specification; matter printed in italics indicates the additions made by reissue.

ABSTRACT OF THE DISCLOSURE

An improved quartz crystal resonator is supported on an all-quartz structure within a quartz enclosure for improved stability with time and temperature.

The long-term frequency stability of a conventional quartz crystal resonator is effected by the relaxation with time of stressing forces within the crystal produced by spring mounts and by the dissimilarities in thermal expansion rates of quartz and of the metallic electrodes attached to the surface of the quartz resonator. Other factors such as plastic flow or fracture of the bond between the resonator and mounting structure and the adsorption of gases on the surfaces of the resonator also effect the long-term frequency stability of the crystal resonator.

Accordingly, it is an object of the present invention to provide a crystal resonator which overcomes these factors and which has improved long-term frequency stability.

It is another object of the present invention to provide a mount for a quartz crystal resonator which reduces the amount of acoustic energy absorbed from the vibrating resonator.

It is a further object of the present invention to provide a crystal resonator which eliminates electrodes on the vibrating resonator surfaces.

In accordance with the illustrated embodiment of the present invention, a quartz crystal resonator having a relatively inactive outer periphery is disposed between upper and lower quartz members which contact the resonator only about its outer periphery. Electrodes are disposed on the vibration-free outer surfaces of the upper and lower quartz members for establishing a vibration-exciting electric field through the resonator.

Figure 1:
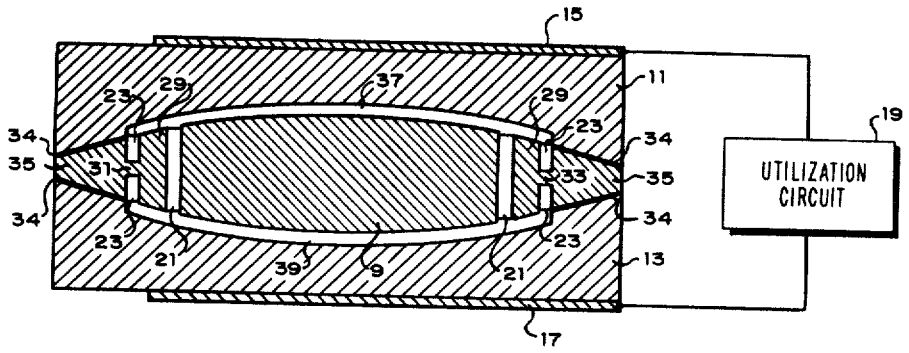
Figure 2:
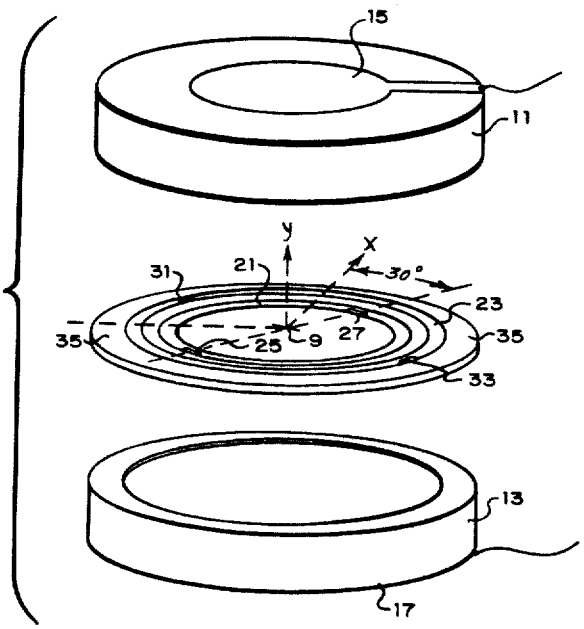

Other and incidental objects of the present invention will be apparent from a reading of this specification and an inspection of the accompanying drawing in which:

FIGURE 1 is a sectional view of one embodiment of a crystal resonator according to the present invention; and FIGURE 2 is an exploded view of the resonator of FIGURE 1.

Referring to the drawing, there is shown a quartz crystal resonator 9 disposed between upper and lower quartz members 11 and 13. Electrodes 15 and 17 on the outer surfaces of the upper and lower members 11 and 13 are connected to a suitable utilization circuit 19 and are disposed to produce a vibration-exciting electric field through the resonator 9 in response to an applied signal. The resonator has at least one convex surface, as shown in FIGURE 1, for concentrating the thickness-shear mode of vibrational activity in the central region of maximum thickness and for reducing the vibrational activity about its periphery. A pair of annular grooves 21 and 23 having general shape as the adjacent surfaces of resonator 9 near its periphery. These grooves are cut through the resonator about substantially the entire circumference of the grooves leaving mounting tabs 25, 27 between resonator 9 and the resulting ring or annulus 29 and mounting tabs 31, 33 between ring 29 and the outer periphery 35 of the resonator crystal 9. This produces a gimbal-type mount for resonator 9 which absorbs only a negligible amount of acoustic energy from resonator 9 through the small cross-sectional area of tabs 25 and 27. This insures high Q or quality operation (i.e., negligible absorption of acoustic energy per cycle of oscillation). Also, this gimbal-type mount isolates the resonator from external forces and stresses which, if applied to the resonator, would shift its resonant frequency. Plastic flow and fracture of bonds between resonator and conventional mounting structures are thus eliminated. The inner surfaces 37, 39 of the upper and lower members 11, 13 have the same general shape as the adjacent surfaces of resonator 9 and are recessed away from such adjacent surfaces to provide space for vibrational movement of the resonator surfaces. The outer periphery 35 of the resonator is bonded between the mating surfaces of the upper and lower sections 11 and 13 to form a hermetically sealed enclosure about the resonator. Since the entire resonator structure is made of the same material with the same crystallographic orientation (or of materials having the same thermal expansion coefficient), frequency-shifting stresses and forces in the resonator 9 remain substantially fixed with time and temperature.

Also, the gimbal-type mount for resonator 9 reduces the frequency-shifting stresses and forces exerted on the resonator due to such factors as different thermal expansion rates of the electrode material and the quartz members, different thermal expansion rates of the bonding material and the quartz members and the relaxation with time of the bond between electrodes 15, 17 and the quartz members 11, 13. The effect upon operating frequency of shock or time-varying forces transmitted through the gimbal-type mount may be reduced further by orienting the diametrically-opposed tabs 31 and 33 at right angles to the diametrically-opposed tab 25 and 27 and by orienting the later tabs at an angle of approximately [90] *30* degrees with respect to the X axis of the resonator crystal. The 30 degree orientation of a support with respect to the X axis of the crystal is commonly known to be the least force-sensitive mounting for a thickness-shear mode AT-cut crystal resonator. Further, since the structure may be evacuated and hermetically sealed, the vapor pressure of absorbed gases remains in equilibrium with the partial gas pressures of each residual gas component inside the structure at various temperatures. The absence of dissimilar surfaces which exhibit dissimilar depurdance of gaseous adsorption with temperature eliminates frequency-shifting mass transfer between surfaces with temperature variations. A resonator constructed according to the present invention thus operates with high Q and extremely slow aging rate to provide a high degree of long-term frequency stability.

We claim:

1. Signal frequency apparatus comprising:

a piezoelectric crystal resonator having a convex surface and another surface and being adapted to vibrate with a relatively inactive periphery in response to an applied electric field;

said resonator having an annular groove near the periphery thereof forming a region of relatively thin cross-section;

a pair of members of the same material as said resonator disposed on opposite sides thereof;

means attaching at least one of said members to said resonator about the outer periphery thereof on the side of said groove remote from the central region of the resonator;

the inner surfaces of said members adjacent said surfaces of the resonator being recessed away from the resonator to permit vibration thereof; and electrodes disposed on said members to produce a vibration-exciting electric field in said resonator in response to signal appearing on said electrodes.

2. Apparatus as in claim 1 wherein:

said annular groove in the resonator passes through the thickness thereof substantially about the entire circumference of the groove leaving at least two tabs of resonator material radially traversing the groove.

3. Signal frequency apparatus comprising:

a piezoelectric crystal resonator having a convex surface and another surface and being adapted to vibrate with a relatively inactive periphery in response to an applied electric field;

said resonator having an annular groove through the thickness of the resonator substantially about the entire circumference of the groove forming a plurality of mounting tabs traversing the groove radially;

a pair of members of the same material of said resonator disposed on opposite sides thereof;

means attaching said members to said resonator about the periphery thereof on the side of said groove remote from the central region of the resonator;

the inner surfaces of said members adjacent said surfaces of the resonator being recessed away from the resonator to permit vibration thereof; and electrodes disposed on said members to produce a vibration-exciting electric field in said resonator in response to signal appearing on said electrodes.

4. Signal frequency apparatus comprising:

a crystal resonator of piezoelectric material having a convex surface and another surface and being adapted to vibrate with a relatively inactive periphery in response to an applied electric field;

a pair of annular grooves of dissimilar radii near the periphery of said resonator extending through the thickness dimension thereof substantially about the entire circumference of the grooves to form an annulus interposed between the outer periphery of the resonator and the central portion thereof, the annulus being attached to the central portion of the resonator by a first set of at least two tabs of resonator material and being attached to the outer periphery of the resonator by a second set of at least two tabs of resonator material;

support means for said resonator;

means attaching the outer periphery of the resonator to said support means; and means for producing a vibration-exciting electric field in said resonator in response to signal appearing on said electrodes.

5. Apparatus as in claim 4 wherein:

the first and second sets of tabs are angularly displaced about said annulus.

6. Signal frequency apparatus comprising:

an AT-cut crystal resonator of piezoelectric material having an X-axis and having a convex surface and another surface, the resonator being adapted to vibrate with a relatively inactive periphery in response to an applied electric field;

a pair of annular grooves of dissimilar radii near the periphery of said resonator extending through the thickness dimension thereof substantially about the entire circumference of the grooves to form an annulus interposed between the outer periphery of the resonator and the central portion thereof, the annulus being attached to the central portion of the resonator by a first set of at least two tabs of resonator material and being attached to the outer periphery of the resonator by a second set of at least two tabs of resonator material;

first and second members of the same material as said resonator disposed on opposite sides of said resonator;

means attaching the outer periphery of the resonator to at least one of the first and second members; and electrodes disposed on the surfaces of said members for producing a vibration-exciting electric field in said resonator in response to signal appearing on said electrodes.

7. Apparatus as in claim 6 wherein:

the first and second sets of tabs are displaced about the annulus by an angle equal to one-half the angle between a pair of tabs in one of the first and second sets; and the X-axis of the crystal resonator is oriented at an angle of approximately 30 degrees with respect to a radius through a tab of the first set.

*8. Signal frequency apparatus comprising:*

*a piezoelectric crystal resonator having a convex surface and another surface and being adapted to vibrate with a relatively inactive periphery in response to an applied electric field;*

*a pair of members of the same material as said resonator disposed on opposite sides thereof;*

*means attaching at least one of said members to said resonator continuously about the outer periphery thereof;*

*the inner surfaces of said members adjacent said surfaces of the resonator being recessed away from the resonator to permit vibration thereof; and*

*electrodes disposed about said resonator to produce a vibration-exciting electric field in said resonator in response to signal appearing on said electrodes.*

*9. Signal frequency apparatus as in claim 8 wherein:*

*said pair of members are disposed on opposite sides of the resonator to enclose said resonator; and*

*said electrodes are disposed on said members to produce a vibration-exciting electric field in said resonator in response to signal appearing on said electrodes.*

References Cited

The following references, cited by the Examiner, are of record in the patented file of this patent or the original patent.

UNITED STATES PATENTS

| | | | |
|---|---|---|---|
| 2,293,485 | 8/1942 | Baldwin | 310—9 |
| 2,343,059 | 2/1944 | Hight | 310—8.9 |
| 2,507,374 | 5/1950 | Franklin | 310—8.9 |
| 2,509,478 | 5/1950 | Caroselli | 310—9.1 |
| 2,677,775 | 5/1954 | Font | 310—8.9 |
| 2,484,004 | 10/1949 | Adams | 310—8.9 |
| 2,807,731 | 9/1957 | Minnich | 310—9.2 |
| 2,824,219 | 2/1958 | Fisher | 310—9.4 |
| 2,829,284 | 4/1958 | Gerber | 310—9.7 |
| 2,877,362 | 3/1959 | Tibbetts | 310—8.9 |
| 2,912,605 | 11/1959 | Tibbetts | 310—9.1 |
| 2,956,184 | 10/1960 | Pollack | 310—8.2 |
| 2,963,597 | 12/1960 | Gerber | 310—9.2 |
| 3,073,975 | 1/1963 | Bigler | 310—9.2 |
| 3,123,727 | 3/1964 | Kritz | 310—9.1 |
| 3,153,156 | 10/1964 | Watington | 310—9.6 |
| 3,159,757 | 12/1964 | Cutler | 310—9.1 |
| 3,173,035 | 3/1965 | Fisher | 310—9.1 |

J D MILLER, Primary Examiner

U.S. Cl. X.R.

310—9.2; 331—155

UNITED STATES PATENT OFFICE

CERTIFICATE OF CORRECTION

Reissue No. 26,707 November 4, 1969

Leonard S. Cutler et al.

It is certified that error appears in the above identified patent and that said Letters Patent are hereby corrected as shown below:

Column 2, line 1, "general shape as the adjacent surfaces of" should read -- different radii are cut in both surfaces of the --.

Signed and sealed this 21st day of April 1970.

(SEAL)
Attest:

Edward M. Fletcher, Jr.
Attesting Officer

WILLIAM E. SCHUYLER, JR.
Commissioner of Patents